(12) United States Patent
Purandare et al.

(10) Patent No.: US 11,907,828 B2
(45) Date of Patent: Feb. 20, 2024

(54) DEEP NEURAL NETWORK ON FIELD-PROGRAMMABLE GATE ARRAY

(71) Applicant: International Business Machines Corporation, Armonk, NY (US)

(72) Inventors: Mitra Purandare, Zurich (CH); Dionysios Diamantopoulos, Thalwil (CH); Raphael Polig, Langnau am Albis (CH)

(73) Assignee: International Business Machines Corporation, Armonk, NY (US)

( * ) Notice: Subject to any disclaimer, the term of this patent is extended or adjusted under 35 U.S.C. 154(b) by 739 days.

(21) Appl. No.: 16/558,446

(22) Filed: Sep. 3, 2019

(65) Prior Publication Data

US 2021/0064975 A1 Mar. 4, 2021

(51) Int. Cl.
| | | |
|---|---|---|
| G06N 3/06 | (2006.01) | |
| G06N 3/063 | (2023.01) | |
| G06N 3/10 | (2006.01) | |
| G06N 3/08 | (2023.01) | |
| G06N 3/04 | (2023.01) | |

(52) U.S. Cl.
CPC ............... *G06N 3/063* (2013.01); *G06N 3/04* (2013.01); *G06N 3/08* (2013.01); *G06N 3/105* (2013.01)

(58) Field of Classification Search
CPC ............ G06N 3/063; G06N 3/04; G06N 3/08; G06N 3/105; G06N 3/0454; G06N 3/045; G06F 30/27; G06F 30/343
See application file for complete search history.

(56) References Cited

U.S. PATENT DOCUMENTS 10,642,630 B1 * 5/2020 Shaddock ................. G06F 8/41
2017/0244414 A1 8/2017 Niu
(Continued)

FOREIGN PATENT DOCUMENTS

CN 105139071 B 12/2015
CN 108229670 A 6/2018
(Continued)

OTHER PUBLICATIONS

Chakradhar et al., "A Dynamically Configurable Coprocessor for Convolutional Neural Networks", Jun. 23, 2010, ISCA '10, pp. 247-257. (Year: 2010).*
(Continued)

*Primary Examiner* — Brent Johnston Hoover
(74) *Attorney, Agent, or Firm* — Jared L. Montanaro; Heather Johnston

(57) ABSTRACT

A field programmable gate array (FPGA) may be used for inference of a trained deep neural network (DNN). The trained DNN may comprise a set of parameters and the FPGA may have a first precision configuration defining first number representations of the set of parameters. The FPGA may determine different precision configurations of the trained DNN. A precision configuration of the precision configurations may define second number representations of a subset of the set of parameters. For each precision configuration of the determined precision configurations a bitstream file may be provided. The bitstream files may be stored so that the FPGA may be programmed using one of the stored bitstream files for inference of the trained DNN.

20 Claims, 4 Drawing Sheets

(56) References Cited

U.S. PATENT DOCUMENTS

| | | | |
|---|---|---|---|
| 2018/0054359 A1* | 2/2018 | Abel | H04L 61/103 |
| 2018/0114117 A1* | 4/2018 | Lin | G06F 9/46 |
| 2018/0157465 A1 | 6/2018 | Bittner | |
| 2019/0042529 A1* | 2/2019 | Nurvitadhi | G06N 3/04 |
| 2019/0050715 A1* | 2/2019 | Ooi | G06F 1/163 |
| 2019/0171420 A1 | 6/2019 | Malaya | |
| 2019/0266481 A1* | 8/2019 | Amir | G06N 3/0635 |
| 2020/0151088 A1* | 5/2020 | Gu | G06F 15/7807 |
| 2021/0350233 A1* | 11/2021 | Saboori | G06N 3/08 |

FOREIGN PATENT DOCUMENTS

| | | |
|---|---|---|
| CN | 108596328 A | 9/2018 |
| CN | 108920177 A | 11/2018 |
| WO | 2021044241 A1 | 3/2021 |

OTHER PUBLICATIONS

Canziani et al., "An Analysis of Deep Neural Network Models for Practical," https://arxiv.org/abs/1605.07678, Apr. 14, 2017, 7 pgs.

Diamantopoulos et al., "A System-level Transprecision FPGA Accelerator for BLSTM with On-chip Memory Reshaping," 2018 International Conference on Field-Programmable Technology (FPT), pp. 341-344.

Guo et al., "[DL] A Survey of FPGA-Based Neural Network Inference Accelerator," https://arxiv.org/abs/1712.08934, arXiv:1712.08934v3 [cs.AR] Dec. 6, 2018, 26 pgs.

Gupta et al., "Deep Learning with Limited Numerical Precision," http://proceedings.mlr.press/v37/gupta15.html, Proceedings of the 32nd International Conference on Machine Learning, Lille, France, 2015, 10 pgs.

J.P. Morgan, "An Inventors' Guide to Artificial Intelligence," AI adoption at an inflection point, Global Equity Research, www.jpmorganmarkets.com, Nov. 27, 2017, 110 pgs.

Nurvitadhi et al., "Can FPGAs Beat GPUs in Accelerating Next-Generation Deep Neural Networks?" http://doi.acm.org/10.1145/3020078.3021740, FPGA'17, Feb. 22-24, 2017, © 2017 ACM, ISBN 978-1-4503-4354-1/17/02, 10 pgs.

Sze et al., "Efficient Processing of Deep Neural Networks: A Tutorial and Survey," https://scholar.google.com/scholar?q=Efficient+Processing+of+Deep+Neural+Networks:+A+Tutorial+and+Survey,+Vivienne+Sze,+et.al.+arXiv.org+2017&hl=en&as_sdt=0&as_vis=1&oi=scholar, arXiv:1703.09039v2 [cs.CV], Aug. 13, 2017, pp. 1-32.

Unknown, "NVIDIA TensorRT," https://developer.nvidia.com/tensorrt, printed Jul. 23, 2019, 10 pgs.

Xu et al., "Scaling for edge inference of deep neural networks," https://vast.cs.ucla.edu/publications/scaling-edge-inference-deep-neural-networks, Nature Electronics, vol. 1, pp. 216-222, Apr. 2018.

International Search Report and the Written Opinion, International application No. PCT/IB2020/057682, International filing date Aug. 14, 2020.

* cited by examiner

DEEP NEURAL NETWORK ON FIELD-PROGRAMMABLE GATE ARRAY

BACKGROUND

The present invention relates to the field of digital computer systems, and more specifically, to a method for inference of a trained deep neural network (DNN) using a field programmable gate array (FPGA).

A FPGA is an integrated circuit designed to be configured by a customer or a designer after manufacturing. The FPGA configuration is generally specified using a hardware description language (HDL). FPGAs contain an array of programmable logic blocks, and a hierarchy of reconfigurable interconnects that allow the blocks to be wired together. Logic blocks can be configured to perform complex combinational functions. However, there is a need to improve a reconfiguration of FPGAs so that different logic functions can be implemented.

SUMMARY

Various embodiments provide a method for inference of a trained DNN, using a FPGA, and a FPGA apparatus. Advantageous embodiments are described below. Embodiments of the present disclosure can be freely combined with each other if they are not mutually exclusive.

A FPGA may be used for inference of a trained DNN. The trained DNN may comprise a set of parameters and the FPGA may have a first precision configuration defining first number representations of the set of parameters. The FPGA may determine different precision configurations of the trained DNN. A precision configuration of the precision configurations may define second number representations of a subset of the set of parameters. For each precision configuration of the determined precision configurations a bitstream file may be provided. The bitstream files may be stored so that the FPGA may be programmed using one of the stored bitstream files for inference of the trained DNN.

The above summary is not intended to describe each illustrated embodiment or every implementation of the present disclosure.

BRIEF DESCRIPTION OF THE SEVERAL VIEWS OF THE DRAWINGS

In the following embodiments of the invention are explained in greater detail, by way of example only, making reference to the drawings in which.

Figure 1:
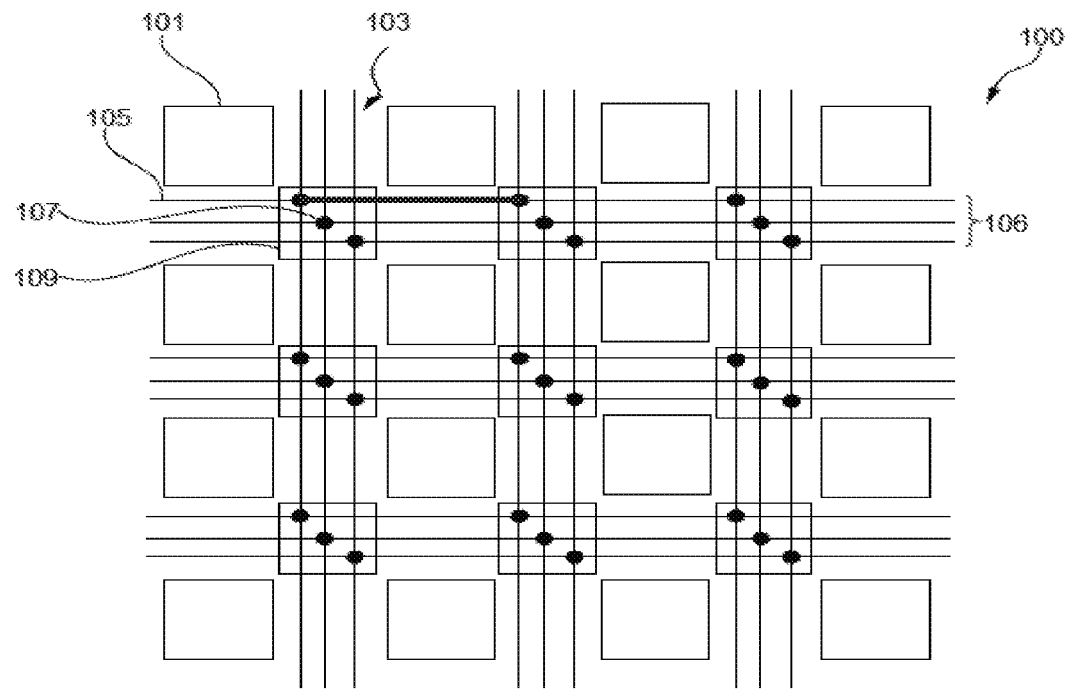
FIG. 1 is a block diagram of a FPGA, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

The descriptions of the various embodiments of the present disclosure will be presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present subject matter may enable a flexible and controllable inference of a DNN by partially reconfiguring a FPGA. This may minimize a network's end to end response time by changing the precisions of the DNN as needed. This may enable the inference response to be provided in near real-time using the present subject matter.

The present subject matter may enable a robust and efficient on-field reconfiguration within a low timing budget (e.g., seconds versus hours or days). The present subject matter may be adapted to different neural networks and/or model parameters. This is in contrast to graphics processing units (GPUs) and application-specific integrated circuits (ASICs), which support a single datatype for performance targeted designs, i.e., FP16, INT8, binary, etc. The present subject matter may enable a hardware reconfiguration with low return-on-investment risks.

Bitstream files may be stored in the FPGA or in a chip to which the FPGA has access. For example, the FPGA may be partitioned into dynamically reconfigurable sub-regions, wherein each sub-region of the sub-regions is configured to perform computations using a respective subset of parameters of the set of parameters. Furthering the example, the FPGA may comprise dynamically reconfigurable sub-regions sub1, sub2 and sub3. The sub-region sub1 may be configured to perform computations using a respective subset of parameters subset1 of the set of parameters. The sub-region sub2 may be configured to perform computations using a respective subset of parameters subset2 of the set of parameters. The sub-region sub3 may be configured to perform computations using a respective subset of parameters subset3 of the set of parameters.

The set of parameters may be formed by the subsets: subset1 and/or subset2 and/or subset3. The first number representations of the set of parameters may comprise a first number representation of each parameter of the subset of parameters. The first number representations may comprise one or more distinct first number representations. The first number representations may, for example, comprise a different first representation for each sub-region of the dynamically reconfigurable sub-regions. For example, the first number representations may comprise a first number representation (e.g., 16-bit representation) for subset1, which is different from a first number representation (e.g., 4-bit representation) for subset2, which is different from a first number representation (e.g., 3-bit representation) for subset3. In another example, more than one subset of parameters may have a same first number representation (e.g., subset1 and subset2 may be represented by a 16-bit representation and subset3 may be represented by a 4-bit representation).

In some embodiments, second number representations of a subset of parameters may comprise a second number representation of each parameter of the subset of parameters. The second number representations of a subset of parameters may comprise one or more distinct second number representations. In a first example, the second number representations of the subset: subset1 may comprise 10 bits for a first portion of subset1 and 16 bits for a remaining second portion of subset1. That is, only the precision of the first portion has changed compared to the first precision configuration. In this case, the bitstream file associated with subset1 may, for example, change all precisions of subset1 such that the 16-bit representation is maintained for the second portion and the 16-bit representation of the first portion is changed to the 10-bit representation.

In a second example, the second representations of the subset of parameters may comprise the same number representation for each parameter of the subset of parameters. Furthering the example, the second number representations of the subset: subset2 may comprise 2 bits for each parameter of subset2. In another example, part of the determined precision configurations may be determined in accordance with the first example and a remaining part of the determined precision configurations may be determined in accordance with the second example.

The terms "first" and "second" of the first number representation and second number representation are used for naming purpose to distinguish the number representation of the precision configurations. The number representation is a representation that can be used to represent a given number. The number representation specifies some way of encoding a number, usually as a string of digits. The number representation may be a sequence of bits. For example, an 8-bit representation may be a number representation that represents the given number. A parameter may have a value, wherein the value may be encoded using a number representation.

According to one embodiment, programming of a FPGA is performed using a partial reconfiguration of the FPGA. This embodiment may be advantageous as it may enable the DNN to efficiently react to environmental changes, or different workload scenarios, by a focused adaptation of the behaviour of the inference process at the FPGA.

According to one embodiment, the programming of the FPGA is performed using a global reconfiguration of the FPGA. This embodiment may seamlessly be integrated in systems that do not support partial reconfigurations. For example, the bitstream file used for programming the FPGA may be used to reconfigure the whole FPGA, e.g., the whole set of parameters; however, the precision configuration may only change for the part of the FPGA for which the bitstream file has been created. That is, the precision is only effectively changed for the subset of parameters and the remaining parameters are still represented as before.

According to one embodiment, the inference of the trained DNN comprises providing an output by the trained DNN in response to receiving an input at the trained DNN, wherein the programming of the FPGA is automatically performed after processing a predefined number of inputs of a set of inputs. This may be advantageous as it may enable the DNN to efficiently control the access to data over time. For example, a user accessing a video file may see the resolution of the video changing over time (e.g., decreasing) depending on the workload at the system that provides the video (e.g., if the workload is too high, the video resolution may be lowered).

According to one embodiment, the method further comprises repeating the programming of the FPGA until all inputs of the set of inputs are processed.

According to one embodiment, the programming of the FPGA may be performed during the inference in response to receiving a request to change the first precision configuration of the DNN into a precision configuration of the one of the stored bitstream file. This may enable a run-time device that can react on time during the inference. This may particularly be advantageous as the time required to get the bitstream files and to program the FPGA may be small compared to exiting methods and may be smaller than the time required to perform the inference by the FPGA.

According to one embodiment, the programming of the FPGA is automatically performed for each inference of the DNN. This may enable the processing of/by the DNN on an individual basis, e.g., for each type of input images the FPGA may be programmed accordingly using a precision configuration that is suitable for the input image.

According to one embodiment, the programming of the FPGA is performed before the inference of the DNN. This may prevent the interruption of the inference process and thus may further speed up the process of inference in accordance with the present subject matter.

According to one embodiment, the programming of the FPGA is automatically performed. The programming of the FPGA may be performed on periodic basis, e.g., every 8 hours, every month, etc. For example, there are time periods where the inference process of the FPGA may heavily be used by users (e.g., peak usage times). In this case, the FPGA may automatically be programmed in these periods using a bitstream file that has a lower precision. For example, the FPGA may comprise a circuitry that is configured to determine, using one or more processing parameters, when the FPGA is to be programmed such that the FPGA can automatically be programmed accordingly. The processing parameter may, for example, comprise a precision level of the output of the FPGA or a latency of the FPGA, e.g., based on values of the processing parameter the FPGA may automatically be programmed using one of the stored bitstream files. In another example, a software component associated with the FPGA may be used to control the FPGA so as to automatically be programmed.

According to one embodiment, the DNN comprises multiple layers, the inference involving a set of layer operations at each layer of the DNN, wherein the subset of parameters are parameters used in the set of layer operations of a predefined layer of the DNN.

According to one embodiment, the DNN is a convolutional neural network (CNN), wherein the CNN comprises multiple layers, the inference involving a set of layer operations at each layer of the CNN, wherein the subset of parameters are parameters used in the set of layer operations of a predefined layer of the CNN.

According to one embodiment, each set of the sets of layer operations is performed by a respective dynamically reconfigurable region of the FPGA, wherein the programming of the FPGA comprises programming one region of the regions.

According to one embodiment, the method may further comprise partitioning the FPGA into a static and dynamic region; partitioning the dynamic region into sub-regions, wherein each sub-region of the sub-regions is configured to perform computations using a respective subset of parameters of the set of parameters; wherein the programming of the FPGA comprises programming a sub-region that corresponds to the subset of parameters. This embodiment may provide an efficient mapping of the DNN to the FPGA. In one example, the subset of parameters may be parameters assigned to a dynamic sub-region of the sub-regions. In another example, the subset of parameters may be assigned to more than one dynamic sub-region of the sub-regions. If more than one sub-region is assigned to the subset of parameters, the more than one sub-region may be programmed by a partial reconfiguration of the FPGA.

According to one embodiment, the partitioning of the FPGA is performed by a graph partitioning algorithm. For example, vertices of the graph may be the layers of the DNN, and edges of the graph may be connections among layers of the DNN.

Referring now to FIG. 1, illustrated is a block diagram of a FPGA 100, in accordance with embodiments of the present disclosure. The FPGA 100 comprises an array of configurable logic blocks (CLB) 101 surrounded by an interconnection network 103. The interconnection network 103 comprises interconnecting wires 105. The connections between input and output ports of the configurable logic blocks 101 and the interconnecting wires 105 may be enabled by switches. The FPGA 100 further comprises configurable switches 107. The configurable switches 107 may for example be four-way or three-way configurable switches.

Each line (respective column) of the FPGA 100 comprises alternatively wire bundles 106 and configurable logic blocks 101. A wire bundle 106 comprises a group of wires 105. The switch 107 is disposed at each crossing of two wires 105 and a group of switches disposed at the crossing of two wire channels 106. This group of switches forms a switch box 109.

Figure 2:
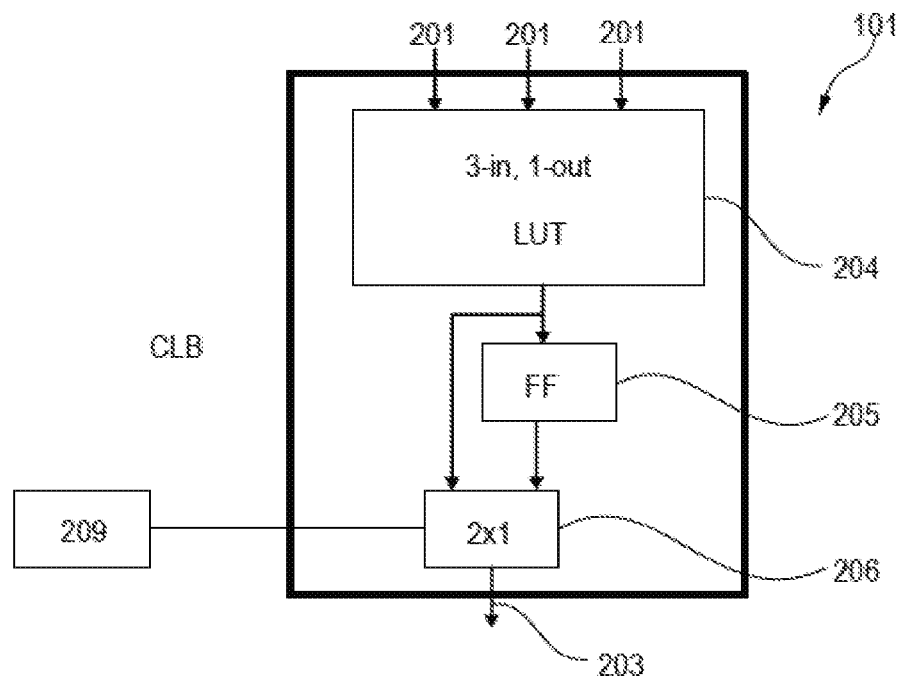
FIG. 2 is a block diagram of a configurable logic block (CLB), in accordance with embodiments of the present disclosure.

The configurable logic blocks 101 are used to provide the basic computation and storage elements used in digital systems. Each configurable logic block 101 of the FPGA 100 may comprise, as shown in FIG. 2, a three or four input ports 201 and one output port 203, wherein each port may be 1-bit wide. A three-input look-up table (LUT) 204 may allow implementing a combinatorial logic function of the three input bits. The input port of a flip-flop (FF) 205 is connected to the output port of the look-up table 204. A (2×1) multiplexer 206 may be used to provide, at the output port 203 of the logic block 101, either the output signal of the flip-flop 205 or that of the look-out table 204. The multiplexer 206 may be driven by a command signal 209 providing a selection bit.

The FPGA 100 may further comprise dedicated input/output blocks (not shown) on the edges of the FPGA 100.

The FPGA 100 may be configured to store in a memory of the FPGA 100, such as static RAM cells, one or more bitstream files, in accordance with the present subject matter. In another example, the bitstream files may be stored on a chip, or board, such that the FPGA can receive, or access, the bitstream files, e.g., the FPGA 100 may be part of the board or chip. A bitstream file may contain all the data required to fully or partially configure the interconnection network 103 and the configurable logic blocks 101. This may comprise, for example, the status of the transistors implementing all the switches of the interconnection network 103, the bits defining the content of each 3-input 1-output look-up table 204 and the value of the selection bit for each configurable logic block 101. Using the bitstream file, the logic blocks as well as the interconnection network 103 may be programmed electronically.

Configurable logic blocks 101 and routing architectures may be interfaced with external components of the FPGA 100 through input/output pads or programmable I/O. Because of the overhead needed by fully programmable logic elements to undertake the implementation of a complex function, the FPGA 100 may further comprise elements to allow performing more efficiently specific tasks such as arithmetic calculations (e.g., multiplication, addition, derivation, etc.) signal processing or interfacing the chip with incoming and outgoing signals.

The FPGA 100 may be a dynamically reconfigurable FPGA that allows only selected portions of the FPGA 100 to be reconfigured. In this way, changes can be made to the FPGA 100 without having to program the entire device, permitting only the selected portions of the FPGA 100 to be reconfigured.

Figure 3A:
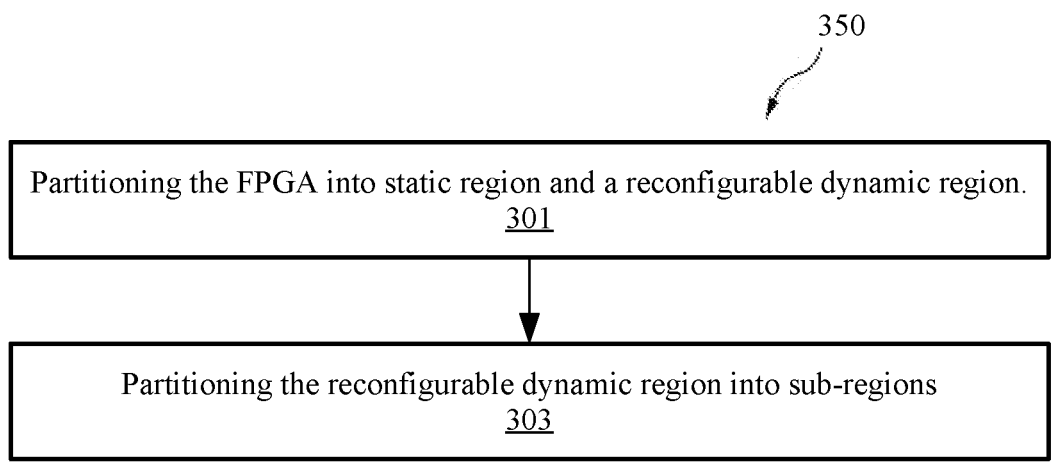
FIG. 3A is a flowchart of a method for mapping a DNN into a FPGA in accordance with an example of the present subject matter, in accordance with embodiments of the present disclosure.
Figure 3B:
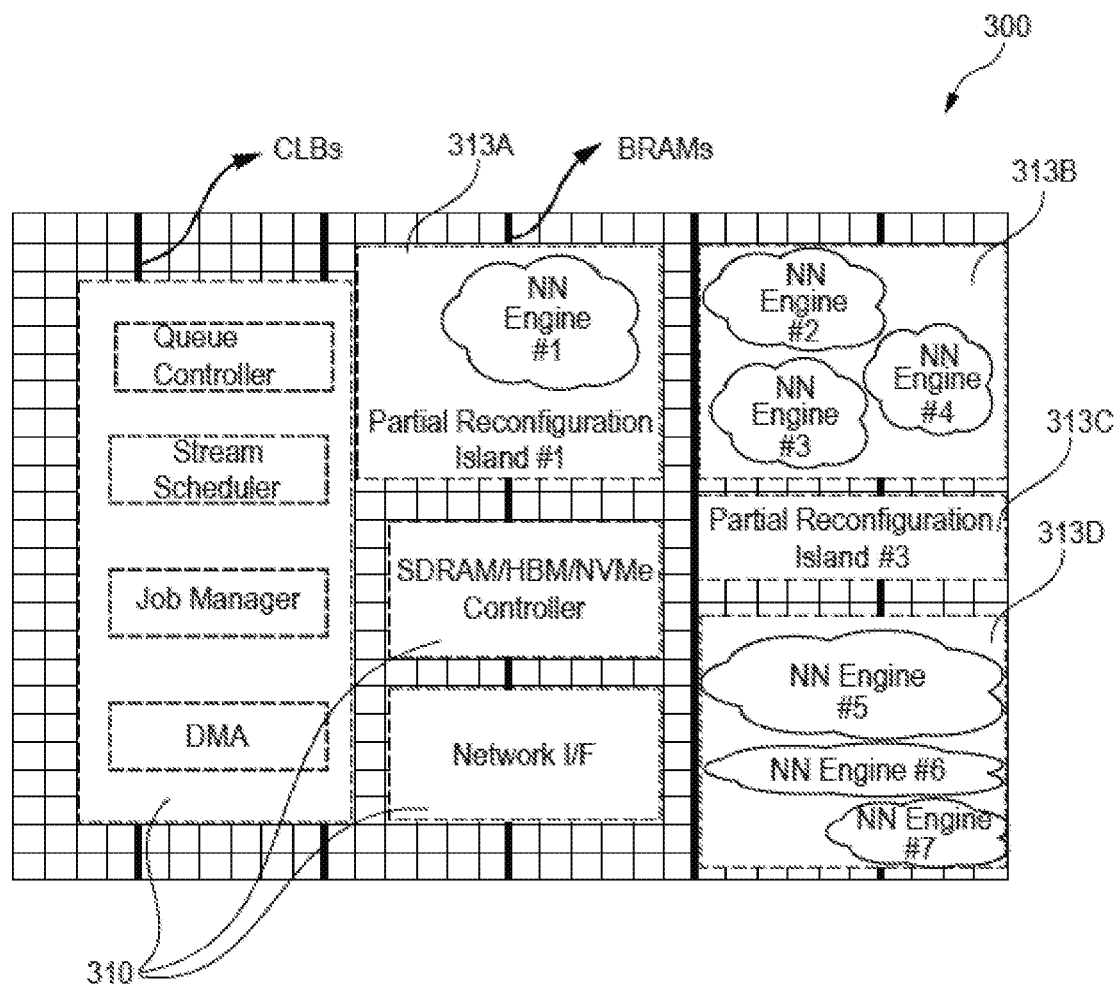
FIG. 3B is a block diagram of a FPGA partitioned in accordance with an example of the present subject matter, in accordance with embodiments of the present disclosure.

The FPGA 100 may be configured to perform inference of a trained DNN such as a CNN. For that the DNN may be mapped to the FPGA 100. FIGS. 3A-B describe a method 350 for mapping a trained DNN into a FPGA 300 which may for example be the FPGA 100 described with reference to FIGS. 1-2.

The trained DNN comprises a set of parameters, such as weights and activation values, whose values are used in computations involved in the inference of the trained DNN. The computations may for example be multiply-accumulate operations. The FPGA 300 has a first or initial precision configuration defining first number representations of the set of parameters. For example, each parameter of the set of parameters may be represented in the FPGA 300 with a respective number representation, e.g., a value of the parameter may be represented using 16 bits, 10 bits, etc.

The FPGA 300 may be a dynamically reconfigurable FPGA that allows only selected portions of the FPGA 300 to be reconfigured. In this way changes can be made to the FPGA without having to program the entire device, permitting only the selected portions of the FPGA to be reconfigured. For that, the FPGA 300 may be partitioned in step 301, into a static region 310 and a reconfigurable dynamic region. Each region of the static and reconfigurable dynamic regions may comprise selected logic blocks and interconnects of the FPGA 300.

The static region 310 may for example comprise elements which may not need to be reconfigured. These elements may, for example, comprise a stream scheduler, job manager a direct memory access (DMA) unit, a network interface, queue controller and a SDRAM controller as shown in FIG. 3B.

The reconfigurable dynamic region may be partitioned in step 303 into sub-regions 313A-D (partial reconfiguration islands), wherein each sub-region of the sub-regions is configured to perform computations using a respective subset of parameters of the set of parameters. For example, the sub-region 313A may comprise a subset of parameters that are needed to perform operations assigned to the sub-region 313A.

For example, in case of a CNN, each of the layers of the CNN, such as convolutional layers, may be assigned to a respective sub-region of the dynamic region of the FPGA 300. That is, the operations involved in a given layer of the CNN may be performed in that sub-region of the FPGA to which the given layer is assigned. In addition, the subset of parameters such as weights and activation values required to perform the computations for the given layer may be stored in the sub-region to which the given layer is assigned. The subset of parameters may be represented in that sub-region with a respective number representation.

Figure 4:
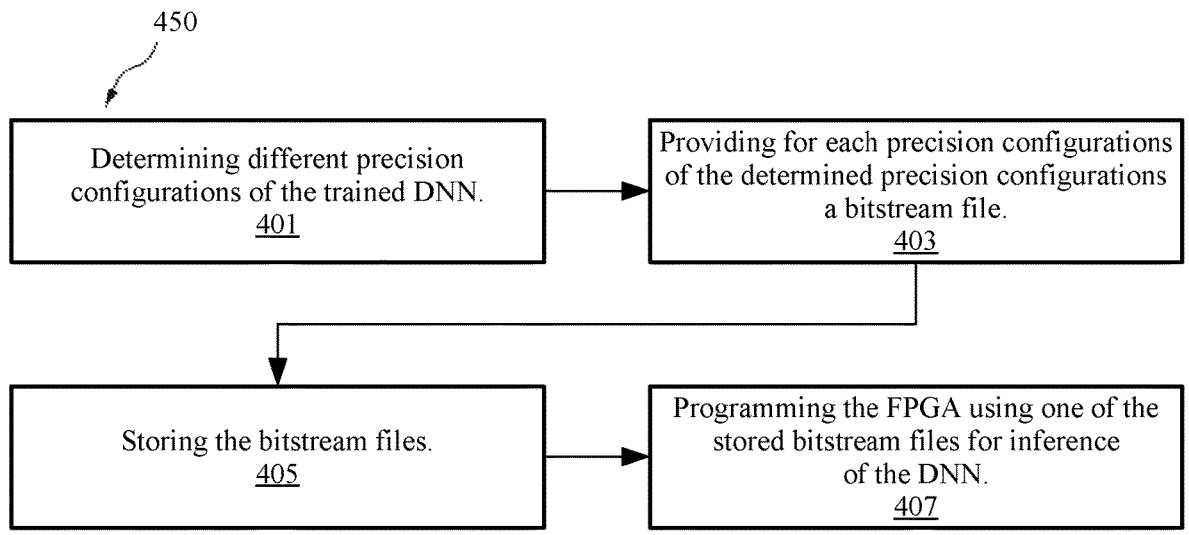
FIG. 4 is a flowchart of a method for inference of a DNN using a FPGA in accordance with an example of the present subject matter, in accordance with embodiments of the present disclosure.

Turning now to FIG. 4, illustrated is a flowchart of a method 450 for inference of a trained DNN using a FPGA such as the FPGA 100 and 300. The trained DNN comprises a set of parameters. The FPGA has a first precision configuration, CFG0, defining first number representations of the set of parameters. For example, in the first precision configuration all parameter values may have the same number representation, e.g., a 16-bit representation. In another example, each parameter of the set of parameters may have a respective first number representation which may, or may not, be the same first number representation of other parameters of the set of parameters. Thus, with the first precision configuration each parameter of the set of parameters may have an initial number representation.

For exemplification purpose, FIG. 4 is described with reference to CNNs, but it is not limited to solely CNNs. For example, the DNN is a CNN, wherein the CNN comprises multiple layers. The inference of the CNN involves a set of layer operations at each layer of the CNN. For simplification, the parameters involved in the set of layer operations of a single layer may have a same number representation, e.g., 16-bit representation, but it is not limited to as they may have different number representations.

For example, each sub-region 313A-D of the FPGA may comprise a respective subset of parameters subA, subB, subC, and subD respectively. The subsets of parameters subA-D form the set of parameters. Each of the subsets of parameters subA-D may have a respective initial number representation, e.g., subA has a 16-bit representation, subB has a-4 bit representation, subC has a 4-bit representation, and subC has a 2-bit representation.

Different precision configurations of the trained DNN may be determined in step 401. For that, the set of parameters may for example be split into different subsets of parameters.

In one example, each subset of parameters comprises parameters used in the set of layer operations of a respective layer of the CNN. In addition, the parameters used in the set of layer operations of a single layer of the CNN may be split into two or more subsets parameters.

In another example, the splitting into the different subsets may be performed based on the mapping of the DNN into the FPGA such that each subset of parameters comprises the parameters of a respective sub-region 313A-D of the reconfigurable dynamic region. This may particularly be advantageous if each layer of the DNN is assigned to a respective sub-region 313A-D. In this example, the subsets of parameters may be the subsets subA, subB, subC, and subD. Thus, the parameters of each subset of parameters may have a same initial number representation.

Step 401 enables the FPGA and/or CNN (e.g., DNN) to identify subsets of the parameters which need to be processed with a number representation different from the initial representation.

The precision configuration of the determined precision configurations may define a second number representation of at least one subset of the set of parameters. For example, the precision configuration may define a second number representation for one or more layers of the CNN. The second number representation is different from the initial representation and may be different for each of the at least one subset of the set of parameters.

Following the example above, the at least one subset of the set of parameters of a precision configuration, CFG1, may for example comprise subA and subD. In this case, the second representation of subA, in CFG1, may be different from the initial 16-bit representation (CFG0) and the second representation of subD may be different from the initial 2-bit representation (CFG0). Another precision configuration CFG2 may define a second number representation for subB only and so on.

For simplification of the description, step 401 may result in two precision configurations CFG1 and CFG2, but it is not limited to two precision configurations.

For each precision configuration of the determined precision configurations a bitstream file may be provided or created or generated in step 403. For example, a bitstream compiler may be used to create the bitstream files as well known in the art.

Further following the example above, two bitstream files may be created for the two precision configurations CFG1 and CFG2. In a first instance, the created bitstream files may enable a partial configuration of the FPGA in accordance with the respective precision configuration. That is, the bitstream file of CFG1 may enable to reconfigure only sub-regions 313A and 313D where the subset of parameters subA and subD are stored or used. And the bitstream file of CFG2 may enable the FPGA and/or CNN (e.g., DNN) to reconfigure only the sub-region 313B where the subset of parameters subB is stored or used.

In a second instance, the created bitstream files may enable a global configuration of the FPGA in accordance with the respective precision configuration. That is, the bitstream file of CFG1 may enable to reconfigure the sub-regions 313A and 313D where the subset of parameters subA and subD are stored or used as well as the sub-regions 313B-C. In this case, the sub-regions 313B-C may maintain, after reconfiguration, the initial/first number representation. And the bitstream file of CFG2 may enable to reconfigure the sub-region 313B where the subset of parameters subB is stored or used as well as the sub-regions 313A and 313C-D. In this case, the sub-regions 313A and C-D may maintain, after reconfiguration, the initial/first number representation.

Both the first and second instances may enable the CNN (e.g., DNN) to dynamically reconfigure the FPGA in order to use new number representations for the parameters used in the inference of the DNN. The first instance may be advantageous as it may speed up the whole process compared to the second case. The second instance may be advantageous as it may seamlessly be integrated in systems that may not allow a partial configuration.

The provided bitstream files may be stored, in step 405. For example, the generated or provided bitstream files may be stored on a FPGA configuration memory of the FPGA so that they can be reconfigured on field at runtime, e.g., through reconfiguration controller such as Internet Content Adaption Protocol (ICAP). In another example, the bitstream files may be stored on a chip, or board, such that the FPGA can receive or access the bitstream files, e.g., the FPGA may be part of that board or chip. This may enable access to a precompiled bitstream pool.

Steps 401-405 may be pre-processing steps which may be performed offline, e.g., at once/simultaneously. This may enable the use of the FPGA at runtime without having to interrupt the process of the inference each time a decision to change the precisions is taken. This may enable an increase in speed and increase in the efficiency of the whole inference process. This may be particularly advantageous as the inference process is usually performed on many input data that requires to run the inference many times using different precisions.

In step 407, the FPGA may be programmed using one of the stored bitstream files for inference of the DNN.

For example, the inference of the trained DNN comprises providing an output by the trained DNN in response to receiving an input at the trained DNN. In this case, the programming of step 407 may automatically be performed after processing a predefined number of inputs of a set of inputs. For example, if the set of inputs comprises 200 images, step 407 may automatically be performed after each time 100 images are processed by the FPGA. For example, for processing the first 100 images, the FPGA may automatically be programmed to switch from CFG0 to CFG1 using the corresponding bitstream file of CFG1 and for processing the second 100 images, the FPGA may automatically be programmed to switch from CFG1 to CFG2 using the corresponding bitstream file of CFG2.

In one example, the programming of the FPGA may be performed during the inference in response to receiving a request to change the first precision configuration CFG0 of the DNN into a precision configuration, e.g., CFG2 of the one of the stored bitstream file. For that, and according to one example the whole FPGA may be interrupted during reconfiguration and the inference may continue after the reconfiguration is completed.

Figure 5:
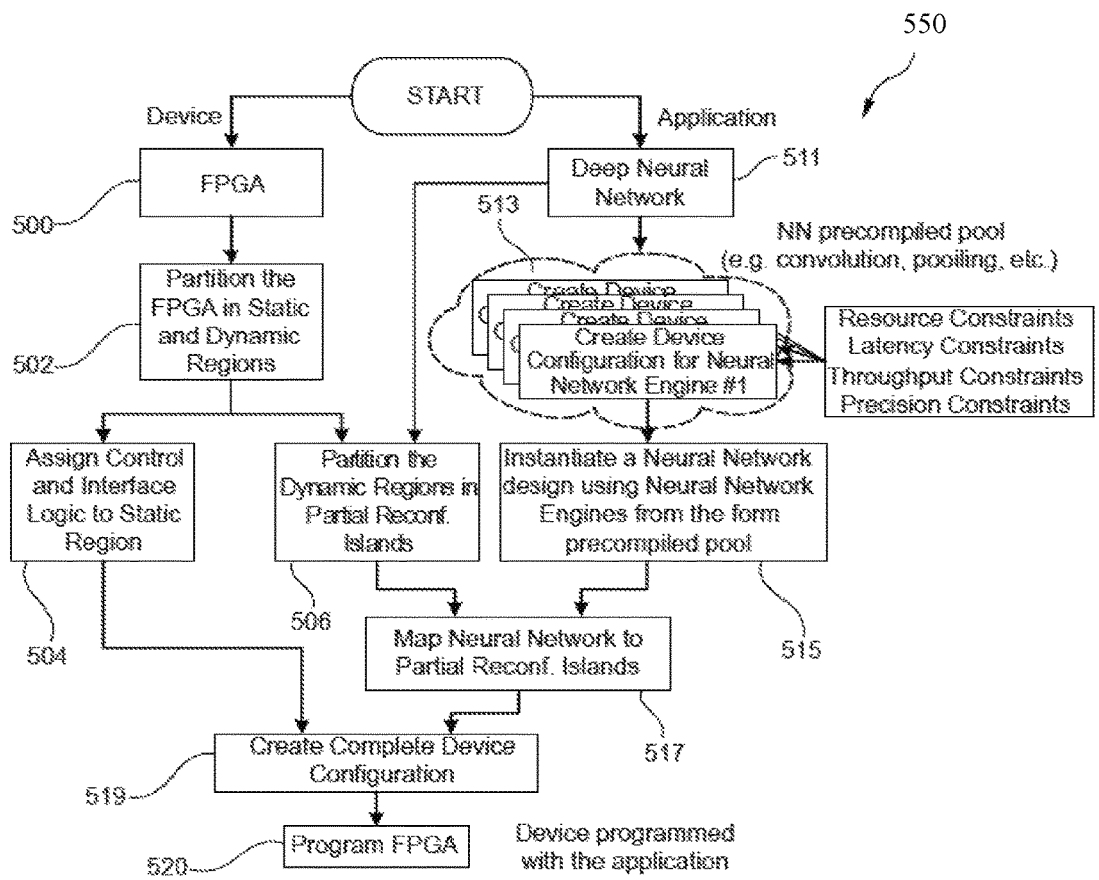
FIG. 5 is a flowchart of a method for mapping a DNN into a FPGA in accordance with an example of the present subject matter, in accordance with embodiments of the present disclosure.

Referring now to FIG. 5, illustrated is a flowchart of a method 550 for mapping a DNN 511 into a FPGA 500, in accordance with an example of the present subject matter. In step 502, the FPGA 500 may be partitioned into static and dynamic regions. In step 504, control and interface logics may be assigned to the static region. The dynamic region may be portioned in step 506 into partial reconfiguration islands. Different network engines may be provided so that each network engine may be assigned to a respective part (e.g., a layer such as a convolution or pooling layer) of the DNN 511.

Each of the network engines may be assigned a respective device/precision configuration in step 513. The device configurations may be determined by taking into account different constraints such as resource constraints, latency constraints, throughput constraints and precision constraints. The device configurations and respective engines may be provided in a precompiled format in a precompiled pool. In step 515, a neural network design may be instantiated using the neural network engines. The DNN may be mapped to the partial reconfiguration regions in step 517, and a complete device configuration may be created in step 519 for enabling programming of the whole FPGA. In step 520, the FPGA 500 may be programmed using the complete device configuration. This may enable to program the FPGA with the application being a DNN.

Figure 6:
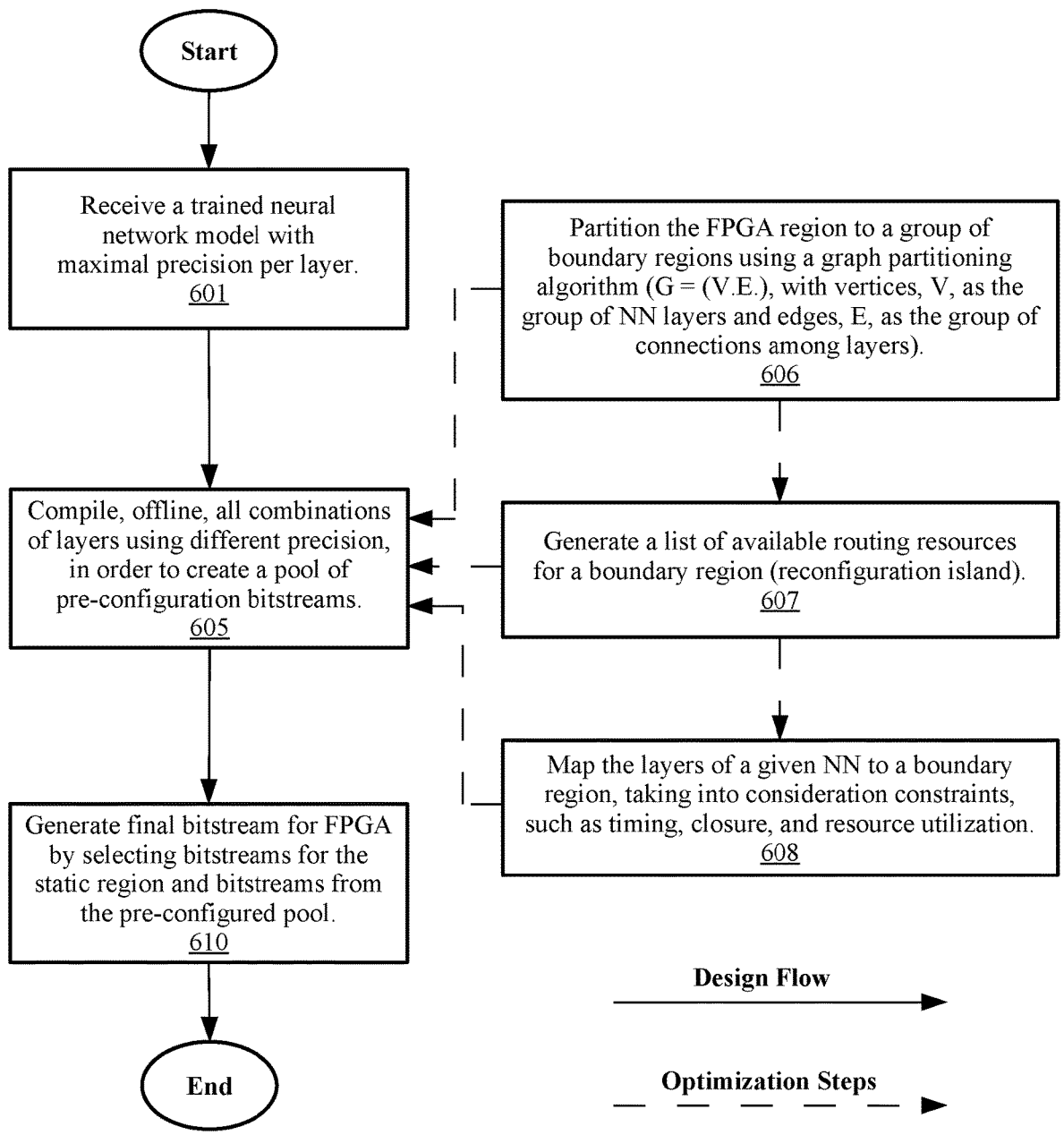
FIG. 6 is a flowchart of a method for enabling inference of a DNN in accordance with an example of the present subject matter, in accordance with embodiments of the present disclosure.

Referring now to FIG. 6, illustrated is a flowchart of a method 650 for enabling inference of a DNN in accordance with an example of the present subject matter. In step 601, a trained DNN may be received. The received trained DNN may have a maximal precision per layer. That is, parameters of each layer of the trained DNN may have a number representation with maximal precision. In some embodiments, all combination of layers may be compiled offline using different precisions in step 605 in order to create a pool of pre-configured bitstreams. Step 605 may, for example, comprise optimization steps 606 to 608. In step 606, the FPGA may be partitioned into a group of boundary regions (or reconfiguration islands) using a graph partitioning algorithm, e.g., vertices of the graph may be the layers of the DNN, and edges of the graph may be connections among layers of the DNN. In step 607, a list of available routing resources for a boundary region may be generated. In step 608, the layers of the DNN may be mapped to the respective boundary regions by taking into account consideration constraints such as timing closure and resources utilization. In step 610, a final bitstream may be generated for the FPGA by selecting bitstreams for the static region of the FPGA and bitstreams from pre-configured pool.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present disclosure may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the disclosure.

What is claimed is:

1. A method for inference of a trained deep neural network (DNN) using a field programmable gate array (FPGA), the trained DNN comprising a set of parameters, wherein the FPGA has a first precision configuration defining first number representations of the set of parameters, the method comprising:
   mapping the trained DNN to the FPGA via a configuration map, the mapping comprising:
      partitioning the FPGA into a static region and a reconfigurable dynamic region;
      partitioning the reconfigurable dynamic region into sub-regions; and
      mapping the trained DNN to the sub-regions of the reconfigurable dynamic region;
   determining different precision configurations of the trained DNN, wherein a precision configuration of the different precision configurations defines second number representations of a subset of the set of parameters;
   compiling a combination of layers of the trained DNN for each of the different precision configurations;
   providing, for each of the different precision configurations, a bitstream file for enabling programming of the FPGA, in accordance with the precision configuration;
   precompiling a bitstream pool with the bitstream files;
   storing the bitstream files; and
   programming the FPGA using one of the stored bitstream files for inference of the DNN and the configuration map, wherein the programming of the FPGA is performed automatically.

2. The method of claim 1, wherein the programming of the FPGA is performed using a partial reconfiguration of the FPGA.

3. The method of claim 1, wherein the programming of the FPGA is performed using a global reconfiguration of the FPGA.

4. The method of claim 1, wherein the inference of the trained DNN comprises:
providing an output by the trained DNN in response to receiving an input at the trained DNN, and wherein the programming of the FPGA is automatically performed after processing a predefined number of inputs of a set of inputs.

5. The method of claim 4, further comprising:
repeating the programming of the FPGA until all inputs of the set of inputs are processed.

6. The method of claim 1, wherein the programming of the FPGA is performed during the inference in response to receiving a request to change the first precision configuration of the DNN into a precision configuration of the one of the stored bitstream file.

7. The method of claim 1, wherein the programming of the FPGA is automatically performed for the inference and each other inference of the DNN.

8. The method of claim 1, wherein the programming of the FPGA is performed before the inference of the DNN.

9. The method of claim 1, wherein the programming of the FPGA is automatically performed before the inference of the DNN.

10. The method of claim 1, wherein the DNN is a convolutional neural network (CNN), wherein the CNN comprises multiple layers, wherein the inference involves a set of layer operations at each layer of the CNN, and wherein the subset of parameters are parameters used in the set of layer operations of a predefined layer of the CNN.

11. The method of claim 10, wherein each set of the set of layer operations is performed by a respective dynamically reconfigurable region of the FPGA, and wherein the programming of the FPGA comprises programming one region of the regions.

12. The method of claim 1, further comprising:
partitioning the FPGA into a static and dynamic region;
partitioning the dynamic region into sub-regions, wherein each sub-region is configured to perform computations using a respective subset of parameters of the set of parameters; and
wherein the programming of the FPGA includes programming a sub-region that corresponds to the subset of parameters.

13. The method of claim 12, wherein the partitioning is performed by a graph partitioning algorithm.

14. A field programmable gate array (FPGA) configured for inference of a trained deep neural network (DNN), the trained DNN comprising a set of parameters, wherein the trained DNN is mapped to the FPGA via a configuration map by partitioning the FPGA into a static region and a reconfigurable region, partitioning the reconfigurable region into sub-regions, and mapping the trained DNN to the sub-regions of the reconfigurable dynamic regions, wherein the FPGA has a first precision configuration defining first number representations of the set of parameters, and wherein the FPGA has access to a precompiled bitstream pool with different stored bitstream files, wherein there is a compilation of a combination of layers of the trained DNN for each of the different precision configurations, the FPGA being configured for:
accessing the different stored bitstream files of the different precision configurations; and
switching from the first precision configuration to a second precision configuration using one of the stored bitstream files and the configuration map, wherein the switching of the FPGA from the first precision configuration to the second precision configuration is performed automatically.

15. The FPGA of claim 14, wherein the second precision configuration defines a second number representations of the set of parameters.

16. The FPGA of claim 15, wherein the FPGA is further configured for:
selecting the one of the stored bitstream files based on the second number of representations of the set of parameters.

17. The FPGA of claim 14, wherein each of the stored bitstream files programs the FPGA with a respective, different precision configuration.

18. The FPGA of claim 17, wherein the FPGA is programmed by performing a partial reconfiguration of the FPGA.

19. The FPGA of claim 17, wherein the FPGA is programmed by performing a global reconfiguration of the FPGA.

20. The FPGA of claim 17, wherein the FPGA is programmed during the inference in response to receiving a request to change the first precision configuration into the second precision configuration of the one of the stored bitstream file.

* * * * *